United States Patent
Heinsoo et al.

(10) Patent No.: US 12,131,225 B2
(45) Date of Patent: Oct. 29, 2024

(54) TUNABLE COUPLER WITH COUPLING EXTENSION

(71) Applicant: IQM Finland Oy, Espoo (FI)

(72) Inventors: Johannes Heinsoo, Espoo (FI); Caspar Ockeloen-Korppi, Espoo (FI)

(73) Assignee: IQM Finland Oy, Espoo (FI)

( * ) Notice: Subject to any disclaimer, the term of this patent is extended or adjusted under 35 U.S.C. 154(b) by 723 days.

(21) Appl. No.: 17/195,165

(22) Filed: Mar. 8, 2021

(65) Prior Publication Data

US 2022/0140001 A1 May 5, 2022

(51) Int. Cl.
| | |
|---|---|
| *G06N 10/00* | (2022.01) |
| *B82Y 10/00* | (2011.01) |
| *G06N 10/20* | (2022.01) |
| *G06N 10/40* | (2022.01) |
| *G06N 10/70* | (2022.01) |
| *H01L 23/525* | (2006.01) |
| *H01L 23/66* | (2006.01) |
| *H01P 5/12* | (2006.01) |
| *H01P 7/08* | (2006.01) |

(52) U.S. Cl.
CPC .............. *G06N 10/00* (2019.01); *B82Y 10/00* (2013.01); *G06N 10/20* (2022.01); *G06N 10/40* (2022.01); *G06N 10/70* (2022.01); *H01L 23/525* (2013.01); *H01L 23/66* (2013.01); *H01P 5/12* (2013.01); *H01P 7/088* (2013.01); *H01L 2223/6627* (2013.01)

(58) Field of Classification Search
CPC ........ G06N 10/00; G06N 10/40; G06N 10/20; G06N 10/70; H01P 7/088; H01P 5/12; H01L 23/5223; H01L 23/525; H01L 23/66; H01L 2223/6627; H10N 69/00; B82Y 10/00
USPC ............ 977/700; 341/133; 365/162; 385/37; 326/3
See application file for complete search history.

(56) References Cited

U.S. PATENT DOCUMENTS

| | | | |
|---|---|---|---|
| 4,937,694 A | 6/1990 | Weber | |
| 2006/0147154 A1* | 7/2006 | Thom | G06N 10/00 385/37 |
| 2022/0187388 A1* | 6/2022 | Phung | H05K 1/145 |

FOREIGN PATENT DOCUMENTS

| | | |
|---|---|---|
| CN | 110738320 | 1/2019 |
| WO | 2017105429 | 6/2017 |
| WO | 2020036673 | 2/2020 |

OTHER PUBLICATIONS

Yan et al , Tunable Coupling Scheme for Implementing High-Fidelity Two Qubit Gates, Physical Rev Mar. 2018.*

(Continued)

*Primary Examiner* — Arnold M Kinkead
(74) *Attorney, Agent, or Firm* — Meunier Carlin & Curfman LLC

(57) ABSTRACT

A tunable coupler for making a controllable coupling to at least a first qubit is disclosed. The tunable coupler includes a first constant coupling element and a tunable coupling element. The first constant coupling element forms a non-galvanic coupling interface to at least the first qubit at a first extremity that is distant from the tunable coupling element. The tunable coupling element is located adjacent to a non-galvanic coupling interface formed as an interface to a circuit element at a second extremity thereof.

15 Claims, 5 Drawing Sheets

(56) References Cited

OTHER PUBLICATIONS

Chougrani et al https://www.researchgate.net/figure/Representation-of-a-cylinder-regarding-the-given-definition_fig23_317129110 (Year: 2017).*

International Search Report and Written Opinion issued to PCT/FI2021/050718 dated Feb. 22, 2022, 6 pages.

Mundada, P. S. et al., "Suppression of Qubit Crosstalk in a Tunable Coupling Superconducting Circuit"; Princeton University, dated Jun. 13, 2019, 11 pages.

Scarlino, P. et al., "Coherent microwave-photon-mediated coupling between a semiconductor and a superconducting qubit"; Nature Communications, article, https://doi.org/10.1038/s41467-019-10798-6, 2019, 6 pages.

Arute, F. et al., "Supplementary information for Quantum supremacy using a programmable superconducting processor"; Google, dated Jan. 1, 2020, 67 pages.

L. Steffen et al., "Deterministic quantum teleportation with feed-forward in a solid state system", Nature, vol. 500, pp. 319-322, Aug. 2013, 1 pages.

F. Yan et al., "Tunable Coupling Scheme for Implementing High-Fidelity Two-Qubit Gates," Phys. Rev. 5 Applied, vol. 10, No. 5, p. 54062, Nov. 2018.

M. C. Collodo et al., "Implementation of Conditional-Phase Gates based on tunable ZZ-Interactions," arXiv:2005.08863, May 2020.

X. Li et al., "A tunable coupler for suppressing adjacent superconducting qubitcoupling," arXiv:1912.10721, 2019.

K. Xu et al., "Emulating Many-Body Localization with a Superconducting Quantum Processor," Phys Rev. Lett., vol. 120, p. 50507, Feb. 2, 2018, doi: 10.1103/PhysRevLett.120.050507.

Extended European Search Report issued to EP Application No. 20204967.2, dated Apr. 23, 2021, 8 pages.

* cited by examiner

TUNABLE COUPLER WITH COUPLING EXTENSION

PRIORITY CLAIM

This application claims priority to European Patent Application No. 20204967.2, filed on Oct. 30, 2020, the entire disclosure of which is incorporated by reference herein.

TECHNICAL FIELD

The invention is generally related to the technology of quantum computing. In particular the invention is related to hardware used to make qubits and to form couplings between two or more qubits.

BACKGROUND

In quantum computing it has become common to use the term qubit to designate not only the basic unit of information but also the information storage element that is used to store one qubit of information. As an example, a superconductive memory circuit with one or more qubits (i.e. qubit-sized information storage elements) can be considered. In such an example, the qubit is an anharmonic oscillator, such as a transmon, and it may be coupled to a nearby readout resonator for facilitating the readout of the state of the qubit stored therein.

To implement a quantum gate it is essential that there are controllable couplings between qubits, so that the states of the qubits can interact with each other in a controlled manner. In the case of electrical qubits that have a characteristic resonance frequency, a relatively simple way to control the coupling between adjacent qubits involves frequency tuning, so that the qubits are tuned to (or close to) resonance for strong coupling (on-position) and detuned for small coupling (off-position). Such an arrangement imposes an upper bound on the gate on-off ratio for a given gate speed. There is no known scalable method to cancel out the unwanted entanglement of idling qubits that results from the weak always-on interaction.

A more versatile way is to use a tunable coupling element between the two qubits, as described for example in F. Yan et al., "Tunable Coupling Scheme for Implementing High-Fidelity Two-Qubit Gates," Phys. Rev. Applied, vol. 10, no. 5, p. 54062, November 2018. However, the known way of using tunable coupling elements involves drawbacks that relate to distances and dimensioning. Sufficient capacitance is also needed between the qubits themselves, not only between each individual qubit and the tunable coupling element, which advocates keeping the qubits relatively close to each other. At the same time, the short qubit-to-qubit distance increases the coupling between unwanted pairs of qubits, as well as between qubits and control leads, introducing crosstalk. The short qubit-to-qubit distance also restricts the amount of space available for other required components, such as readout resonators for example.

There is a need for structural and functional solutions that enable sufficiently strong, yet controllable coupling between qubits while simultaneously eliminating unwanted crosstalk. There is also a need for structural and functional solutions that provide significant freedom in the way in which qubit circuit hardware is designed and implemented.

SUMMARY

It is an objective to provide an arrangement that enables strong, yet controllable coupling between qubits while simultaneously eliminating unwanted crosstalk. It is another objective to provide an arrangement that enables freedom in the way in which qubit circuit hardware is designed and implemented.

The objectives disclosed herein are achieved using tunable couplers with separate coupling extenders to implement the coupling between qubits that can be made to implement a gate in quantum computing.

According to a first aspect, there is provided a tunable coupler for making a controllable coupling to at least a first qubit. The tunable coupler includes a first constant coupling element and a tunable coupling element. The first constant coupling element forms a non-galvanic coupling interface to at least the first qubit at a first extremity of the first constant coupling element distant from the tunable coupling element. The tunable coupling element is located adjacent to a non-galvanic coupling interface formed as an interface to a circuit element at a second extremity of the first constant coupling element.

According to an embodiment, the first constant coupling element is a waveguide. This provides an advantage where the length of the first constant coupling element can be used to make the distances between other circuit elements sufficiently long.

According to an embodiment, the first constant coupling element is a waveguide resonator. In addition to the advantages mentioned above, this provides an advantage where the resonance characteristics of the first constant coupling element may be used to set the strength of each electromagnetic coupling of the first constant coupling element.

According to an embodiment, the first constant coupling element is a lumped element resonator. This provides an advantage where the characteristic impedance of the first constant coupling element may be selected from a very wide range, thereby enabling the first constant coupling element to mediate a very strong coupling between qubits.

According to an embodiment, the first constant coupling element is a conductor island. This provides an advantage where dimensions of the first constant coupling element can be effectively utilized together with quantum dot qubits.

According to an embodiment, the tunable coupler comprises a second constant coupling element that forms a non-galvanic coupling interface to a second qubit at an extremity of the second constant coupling element distant from the tunable coupling element. The tunable coupling element may be located adjacent to a non-galvanic coupling interface formed between the first and second constant coupling elements. This provides an advantage where there may be a coupling between the first and second constant coupling elements, and the tunable coupling element may be used to affect the strength of that coupling.

According to an embodiment, the second constant coupling element is one of a waveguide, a waveguide resonator, a lumped element resonator, or a conductor island. Each of these alternatives involves similar advantages that were already mentioned above with respect to the first constant coupling element.

According to an embodiment, the first and second constant coupling elements are waveguides, and each of them comprises a respective coupling area at the respective extremity adjacent to which the tunable coupling element is located. The respective coupling areas of the first and second constant coupling elements both comprise a first edge adjacent to the first edge of the other coupling area and a second edge adjacent to a respective edge of the tunable coupling element. This provides an advantage where the couplings between the various elements can be designed at great accuracy and reproducibility.

According to an embodiment, the tunable coupling element occupies a first sector of an annular two-dimensional region, and each of the respective coupling areas of the first and second constant coupling elements occupies a respective further sector of the annular two-dimensional region. The further sectors may be adjacent sectors of the annular two-dimensional region. Together the first sector and the further sectors may cover the whole of the annular two-dimensional region. This provides an advantage where the desired characteristics of the elements may be realized in a very compact size and shape.

According to an embodiment, the tunable coupler comprises a chain of consecutive constant coupling elements, of which the first constant coupling element is one, with non-galvanic coupling interfaces formed between consecutive constant coupling elements in the chain. The tunable coupler may comprise at least two tunable coupling elements, each of the at least two tunable coupling elements being adjacent to a respective one of the non-galvanic coupling interfaces formed between consecutive constant coupling elements in the chain. This provides an advantage where even very large quantum computing circuits may be designed using the principles disclosed above.

According to a second aspect, there is provided a quantum computing circuit that comprises a tunable coupler of the kind disclosed above and at least one qubit. The tunable coupler forms a controllable coupling to the at least one qubit.

According to an embodiment, the quantum computing circuit comprises two qubits. In this embodiment, the tunable coupler is configured to form a controllable coupling between the two qubits. This is advantageous because an accurately controllable coupling can be formed between the two qubits while minimizing crosstalk and other disadvantageous effects that are typical to prior art solutions.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION

Figure 1:
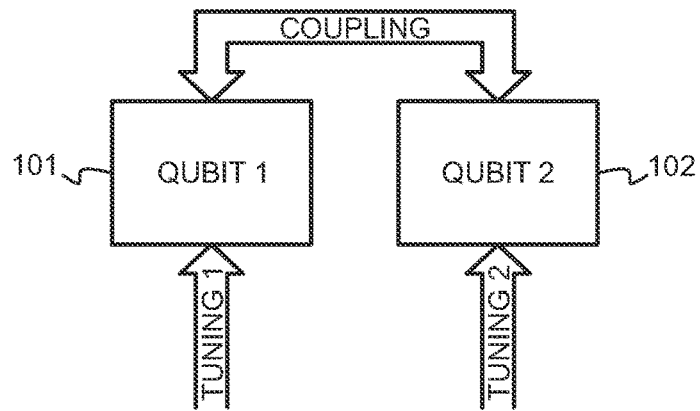
FIG. 1 illustrates known constant coupling between two qubits.

FIG. 1 is a known example of how coupling between two qubits 101 and 102 can be affected by tuning the qubits. Assuming that the qubits 101 and 102 form a standard two-qubit gate, its on and off positions correspond to strong and weak coupling between the qubits. In FIG. 1, there is a dedicated tuning input for each of the qubits 101 and 102, which can be used to change the resonance frequency of the corresponding qubit. For the off position, the qubits are detuned. Such an arrangement exhibits the disadvantageous features referred to above in the description of prior art.

Figure 2:
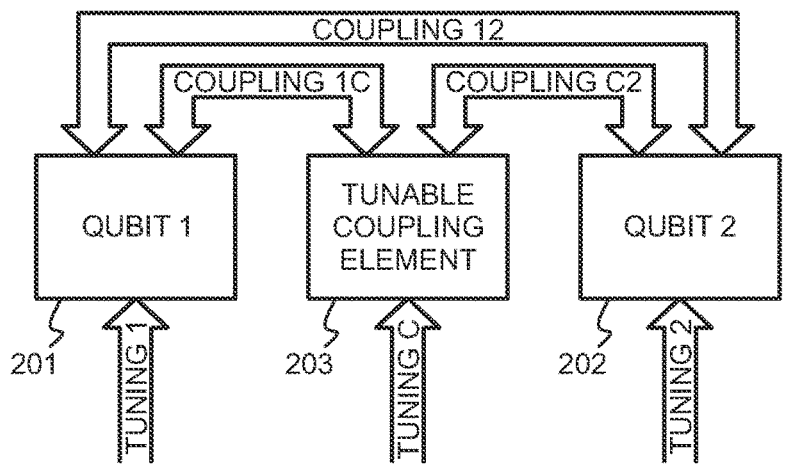
FIG. 2 illustrates the use a known tunable coupling element between two qubits.
Figure 3:
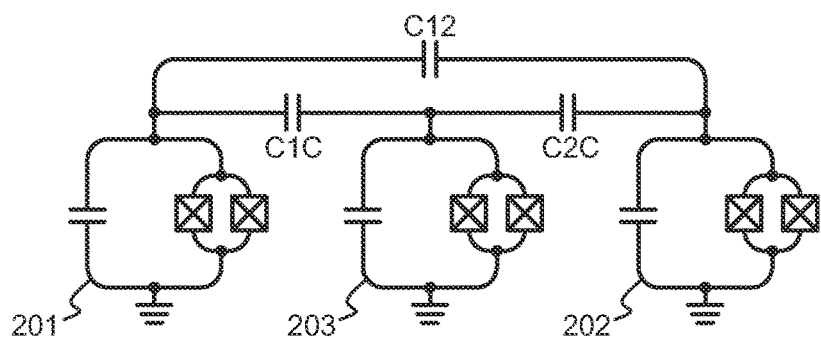
FIG. 3 illustrates the principle of FIG. 2 in a different graphical representation.

FIG. 2 is a known example of using a tunable coupling element 203 to affect the coupling between two qubits 201 and 202. FIG. 3 illustrates the same in the form of a schematic circuit diagram. The capacitive couplings 1C, C2, and 12 of FIG. 2 appear as the capacitors C1C, C2C, and C12 shown in FIG. 3 respectively. The tuning inputs shown in FIG. 2 are omitted from FIG. 3 for graphical clarity. Detuning between the first qubit 201 and the tunable coupling element 203 affects the coupling 1C. Similarly, detuning between the second qubit 202 and the tunable coupling element 203 affects the coupling C2. The mutual tuning of the two qubits 201 and 202 affects the coupling 12. In addition to tuning, the physical distance between each pair of circuit elements also has an important effect on their coupling.

It is important to understand that for the appropriate operation of the arrangement shown in FIG. 2, the qubits 201 and 202 and the tunable element 203 must be relatively close to each other, so that in addition to the capacitances 1C and C2, capacitance C12 is present and has a sufficient magnitude. This in turn results in the couplings between unwanted pairs of qubits and control leads. The unwanted couplings become even greater in larger systems with more qubits.

Figure 4:
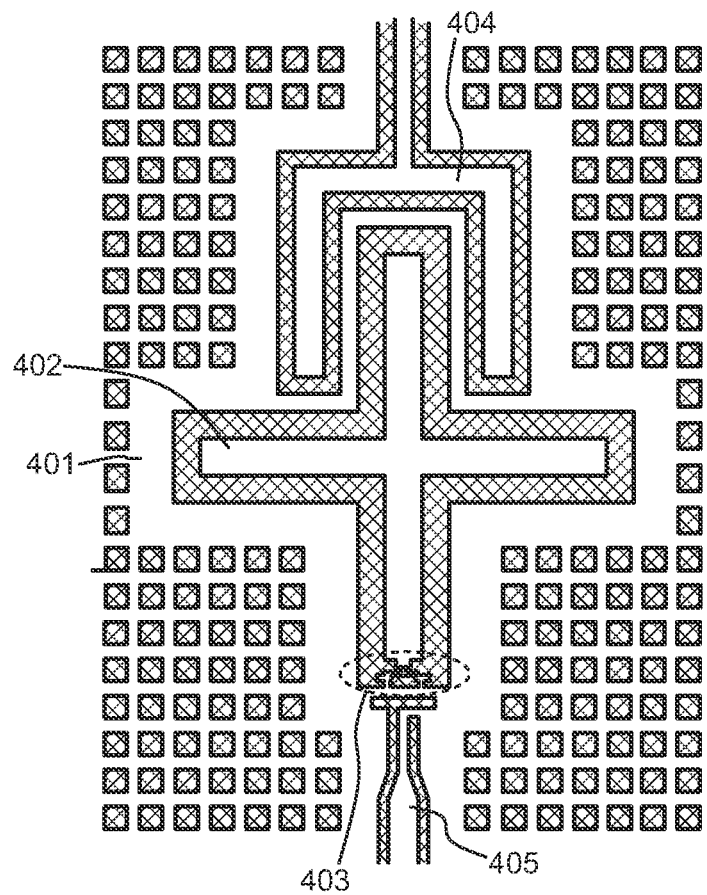
FIG. 4 illustrates an example of a known qubit and a capacitive coupler.

In many of the following drawings the simplified form of a plus-sign is used for qubits (and in some cases also for tunable coupling elements). FIG. 4 is provided to give and explanation of how such a plus-formed circuit element may look like in practice. FIG. 4 is a top view of a quantum computing circuit in which a substrate (such as silicon or sapphire for example) has layers and patterns of conductive and/or superconductive materials deposited on a surface thereof. Cross-hatched areas in FIG. 4 illustrate bare portions of the substrate surface, while solid white areas illustrate conductive and/or superconductive material.

Most of the surface of the substrate is filled with a ground plane 401, made of superconductive material and patterned with a matrix of small openings to reduce the effect of unwanted eddy currents. The plus-formed area 402 of superconductive material constitutes the capacitive part of a qubit, while the detailed patterns at 403 comprise the Josephson junction(s). Two examples are shown of how another circuit element in the quantum computing circuit may form a non-galvanic coupling interface to the qubit. At the top, the fork-formed area 404 implements a capacitive coupling through the top branch of the plus-formed area 402. At the bottom, the end of a transmission line 405 forms another kind of non-galvanic coupling interface to that part of the qubit where the Josephson junction(s) is/are located.

Figure 5:
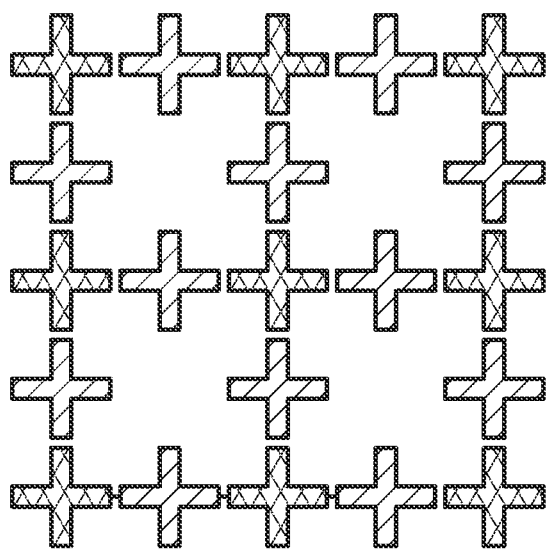
FIG. 5 illustrates an arrangement of X-shaped qubits and tunable coupling elements, according to an embodiment disclosed herein.
Figure 6:
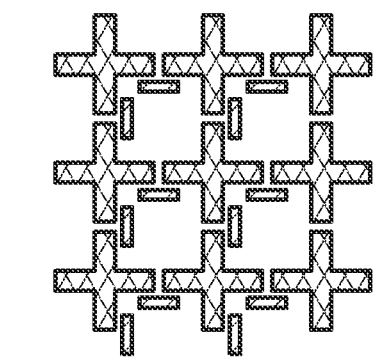
FIG. 6 illustrates an arrangement of X-shaped qubits and slab-shaped tunable coupling elements, according to an embodiment disclosed herein.

FIG. 5 shows how the principle of using tunable coupling elements for qubit-to-qubit coupling explained above with reference to FIGS. 2 and 3 may be utilized in an array of qubits. Here the 'cross-hatched' plus signs are qubits and the 'simply hatched' plus signs therebetween are the tunable coupling elements. FIG. 6 shows another example, in which the tunable coupling elements are not plus-shaped but 'simple line-shaped' and appear adjacent to the mutually facing branches of the plus-shaped qubits, the coupling of which they affect. Irrespective of the shape of the tunable coupling element, the distance between the qubits cannot be increased since this would reduce the direct capacitance (shown as C12 in FIG. 3) between the qubits. As a result, both in FIG. 5 and in FIG. 6 the qubits must be relatively close to each other, which introduces crosstalk between qubits. The tight spacing also restricts the amount of space available on the surface of the substrate for other necessary circuit elements, such as readout resonators that are not shown in the schematic representation in FIGS. 5 and 6.

The distance between adjacent qubits is also linked to the size and shape of the tunable coupling element. When the qubits are close to each other, the direct capacitance between two qubits is large enough even if the tunable coupling element is plus-shaped (the same shape as the qubits themselves). Using a line-shaped or slab-shaped tunable coupling element, like the element shown in FIG. 6, the qubits can be brought even closer to each other. This means increased coupling between the qubits and consequently faster gates, but at the price of even more qubit-qubit crosstalk.

Figure 7:
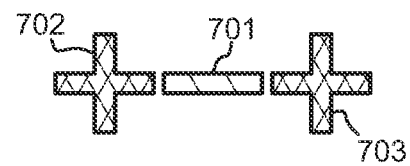
FIG. 7 illustrates two X-shaped qubits with a non-tunable coupling element between them, according to an embodiment disclosed herein.

FIG. 7 illustrates the concept of a quantum bus, which is essentially an extended conductor 701, the ends of which each form a non-galvanic coupling interface to a respective qubit. Such an extended conductor 701 may also be called a constant coupling element because it is not tunable. In the graphical representation, a different kind of a 'simple hatch' (sparser, and inclined to left) is used to emphasize the difference with the tunable coupling elements shown in FIGS. 5 and 6. The left end of the extended conductor 701 forms a non-galvanic coupling interface to a first qubit 702, and the right end of the extended conductor 701 forms a non-galvanic coupling interface to a second qubit 703. The quantum bus provides a way of increasing the distance between two qubits, thus reducing crosstalk and crowding issues on the surface of the substrate, while maintaining sufficient qubit-to-qubit capacitive coupling.

Figure 8:
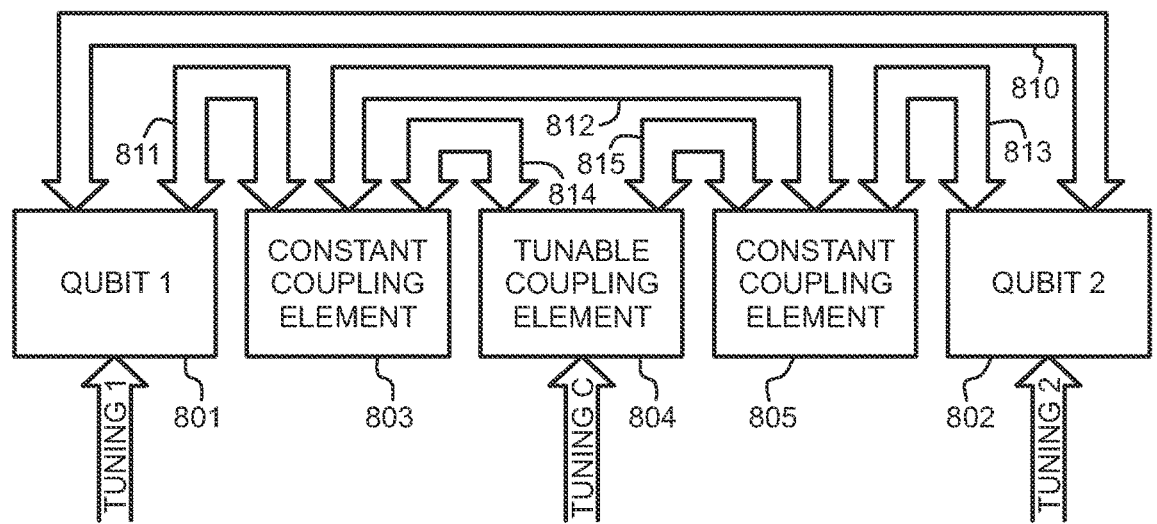
FIG. 8 illustrates an example of using both tunable and non-tunable coupling elements, according to an embodiment disclosed herein.

FIG. 8 illustrates the principle of a tunable coupler for making a controllable coupling to (or between) two qubits 801 and 802. The tunable coupler comprises a first constant coupling element 803 and a tunable coupling element 804. In the embodiment of FIG. 8, the tunable coupler also includes a second constant coupling element 805.

The first constant coupling element 803 forms a non-galvanic coupling interface to the first qubit 801. The schematic representation in FIG. 8 does not take any position concerning the physical outline of the various elements, but it may be assumed that the non-galvanic coupling interface to the first qubit 801 is formed at a first extremity of the first constant coupling element that is distant from the tunable coupling element 804.

The tunable coupling element 804 is located adjacent to a non-galvanic coupling interface formed as an interface to a circuit element (e.g., an interface to the second constant coupling element 805) at a second extremity of the first constant coupling element 803. This feature is shown in more detail in FIGS. 9 and 10.

Figure 9:
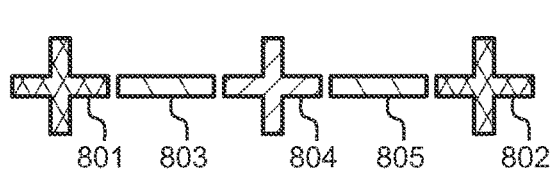
FIG. 9 illustrates an example of a possible implementation of the principle of FIG. 8, according to an embodiment disclosed herein.

In FIG. 9, the two qubits 801 and 802 are plus-formed, as is the tunable coupling element 804 in the middle. The constant coupling elements 803 and 805 are line- or slab-formed. The mutual arrangement of the elements in FIG. 9 is otherwise like that described above with reference to FIG. 8, but the tunable coupling element 804 is not located adjacent to a non-galvanic coupling interface formed to a further circuit element at a second extremity of the first constant coupling element 803. Rather, in FIG. 9 the tunable coupling element 804 is located between, and fills a gap between, the "second extremity" (i.e. right end) of the first constant coupling element 803 and the closest part of the second constant coupling element 805. As a result, there is a relatively weak direct coupling between the constant coupling elements 803 and 805 in FIG. 9.

Figure 10:
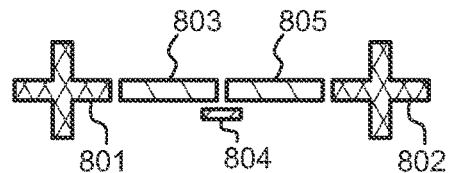
FIG. 10 illustrates another example of a possible implementation of the principle of FIG. 8, according to an embodiment disclosed herein.

In FIG. 10, the tunable coupling element 804 is line- or slab-formed, and located adjacent to a non-galvanic coupling interface formed as an interface to another circuit element at the second extremity of the first constant coupling element 803. Namely, the first extremity of the first constant coupling element 803 is its left end, where a non-galvanic coupling interface is formed to the first qubit 801. The second extremity of the first constant coupling element 803 is its right end, where—in FIG. 10—a non-galvanic coupling interface is formed to the second constant coupling element 805.

In the embodiment of FIG. 10, the second constant coupling element 805 forms a non-galvanic coupling interface to the second qubit 802 at an extremity of the second constant coupling element 805 distant from the tunable coupling element 804. The tunable coupling element 804 is located adjacent to the non-galvanic coupling interface formed between the first and second constant coupling elements 803 and 805 in the middle.

The couplings between the various elements are schematically shown in the upper part of FIG. 8. In comparison with FIG. 10, there is a direct qubit-to-qubit coupling 810, but—due to the relatively large distance between the qubits 801 and 802 in FIG. 10—it is relatively weak. Quite to the contrary, the close proximity of the respective element pairs means that there are a number of couplings that may be relatively strong including the coupling 811 between the first qubit 801 and the first constant coupling element 803, the coupling 812 between the first and second constant coupling elements 803 and 805, and the coupling 813 between the second coupling element 805 and the second qubit 802. The strength of the couplings 814 and 815 between the constant coupling elements 803 and 805 and the tunable coupling element 804 respectively depends on how the tunable coupling element 804 is tuned. If the constant coupling elements 803 and 805 are resonators, they can also be tuned, which further affects the strength of the couplings 814 and 815. If the constant coupling elements 803 and 805 are coupler islands, short waveguides, or other such elements that cannot themselves be tuned, the effective coupling 810 resulting from all the other couplings depends on how the qubits 801, 802 and the tunable coupling element 804 are tuned.

Figure 11:
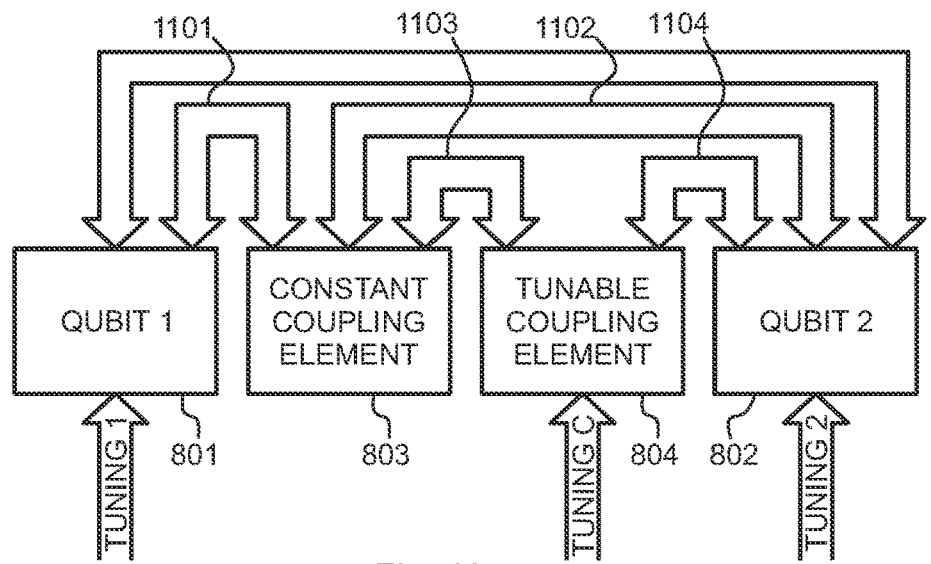
FIG. 11 illustrates another example of using both tunable and non-tunable coupling elements, according to an embodiment disclosed herein.
Figure 12:
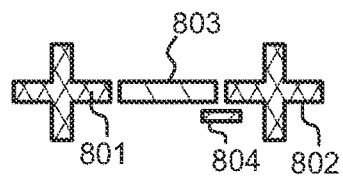
FIG. 12 illustrates an example of a possible implementation of the principle of FIG. 11, according to an embodiment disclosed herein.

FIGS. 11 and 12 illustrate another embodiment. Compared to FIGS. 8 and 10, the second constant coupling element 805 is missing. Rather, in FIGS. 11 and 12 the further circuit element to which there is formed a non-galvanic coupling interface at the second extremity of the first constant coupling element 803 is the second qubit 802. In the embodiment of FIGS. 11 and 12, there are two couplings that may be relatively strong due to the close proximity of the respective element pairs are: the coupling 1101 between the first qubit 801 and the first constant coupling element 803, and the coupling 1102 between the first constant coupling element 803 and the second qubit 802. The strength of the couplings 1103 and 1104 between the first constant coupling element 803 and the tunable coupling element 804 and between the last-mentioned and the second qubit 802 depends on how the first qubit 801, the tunable coupling element 804, and the second qubit 802 are tuned.

The effect of the constant coupling element (as element 803 in FIG. 12) or the chain of constant coupling elements (as elements 803 and 805 in FIG. 10) is that sufficient effective qubit-to-qubit coupling, comparable to C12 in FIG. 3, is achieved even if the qubits 801 and 802 are relatively far apart. The tunable coupling element 804 does not mediate the coupling between the qubits directly (as it did in the embodiments of FIGS. 2, 3, 5, and 6). Instead, the tunable coupling element 804 mediates the coupling between the two constant coupling elements (as in FIG. 10), between the constant coupling element and one of the qubits (as in FIG. 12), or between the constant coupling element and some other kind of further circuit element.

Constant coupling elements of the kind described above with respect to FIGS. 8 to 12 can alternatively be called coupling extenders. They enable the placement of the qubits further apart than in previously known solutions, which in turn gives space for larger ground planes, vias, or bump bonds to other ground layers in between the qubits. More grounding in between the qubits means lower crosstalk.

Any of the constant coupling elements described above may be a waveguide resonator, which means that the coupling element in question has a length comparable to the characteristic wavelength at a given frequency of interest. Waveguides are particularly convenient for use as constant coupling elements for transmon qubits. This is because the typical characteristic dimension of a transmon qubit is about one twentieth of the wavelength at resonance frequency, while a recommendable minimum distance between two transmon qubits for low crosstalk is around 10 times the characteristic dimension of the transmon qubit.

The coupling strength between a waveguide (which is used as a constant coupling element or, in other words, a coupling extender) and a qubit is enhanced if the length of the waveguide is close to an integer number of half-wavelengths on the frequency of interest. If this is the case, the waveguide (or the constant coupling element the dimensions of which make it a waveguide) is a waveguide resonator. While such a higher coupling strength allows faster two-qubit gates, the coupling is enhanced for the resonant frequency only. This phenomenon, called frequency dispersion, makes the circuit design more sensitive to imprecision in dimensioning and manufacturing.

According to another embodiment, any of the constant coupling elements may be a lumped element resonator. In addition to the coupling enhancement at resonance frequencies as for waveguide resonators, a lumped element resonator enables designing the characteristic impedance in a much wider range, enabling even stronger coupling between the qubits. However, in addition to strong frequency dispersion, the self-resonance frequency of a lumped element resonator can be very sensitive to the geometry of other circuit elements nearby, which may make designing the quantum computing circuit quite challenging.

According to yet another embodiment, any of the constant coupling elements may be a conductor island. A conductor island is a circuit element that has an insignificant self-inductance and coupling to the ground. Conductor islands are particularly useful as constant coupling elements for quantum dot qubits because the practical distance between them may be much smaller than the wavelength at the typical resonant frequency of the qubit for a realistic coupling element geometry.

Figure 13:
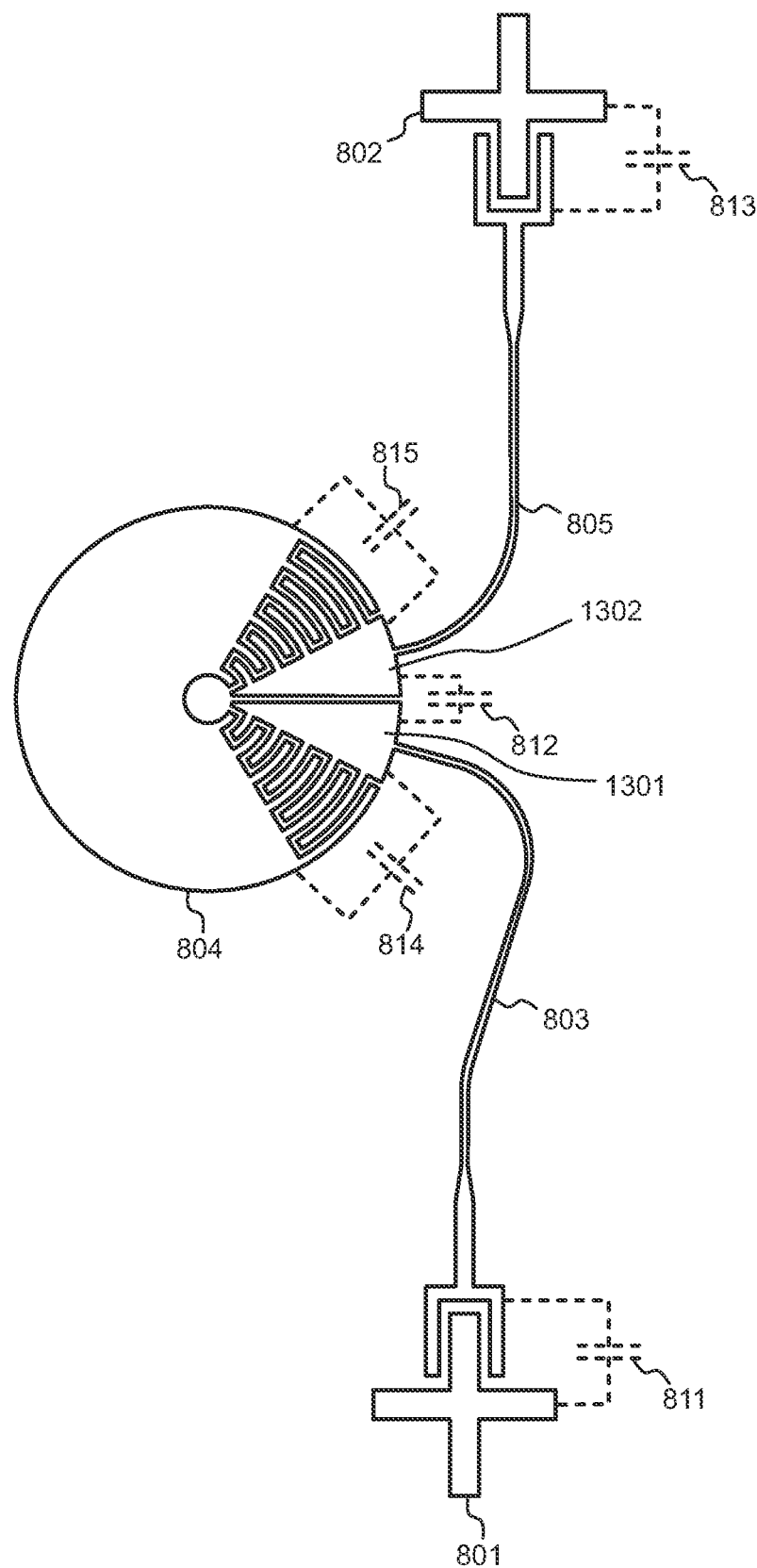
FIG. 13 illustrates an example of a possible implementation of the principle of FIG. 8, according to an embodiment disclosed herein.

FIG. 13 illustrates a tunable coupler according to an embodiment, as well as two qubits 801 and 802. The tunable coupler comprises a first constant coupling element 803, a tunable coupling element 804, and a second constant coupling element 805. The first constant coupling element 803 forms a non-galvanic coupling interface to the first qubit 801 at its first extremity, which is the one distant from the tunable coupling element 804. The second constant coupling element 805 forms a non-galvanic coupling interface to the second qubit 802 at its extremity distant from the tunable coupling element 804. The tunable coupling element 804 is located adjacent to the non-galvanic coupling interface formed between the first and second constant coupling elements 803 and 805. In other words, the last-mentioned non-galvanic coupling interface is between those extremities of the first and second constant coupling elements 803 and 805 that are closest to the tunable coupling element 804. Ground planes and tuning connections are not shown in FIG. 13 to maintain graphical clarity. Capacitors shown in dashed lines illustrate the capacitive couplings between elements with the same reference designators as above in FIG. 8.

In the embodiment of FIG. 13, each of the first and second constant coupling elements 803 and 805 is a waveguide. Each of constant coupling elements 803 and 805 comprises a respective coupling area at that extremity adjacent to which the tunable coupling element 804 is located. These coupling areas are shown with reference designators 1301 and 1302 in FIG. 13. Their form is suitable for creating the respective capacitive couplings between the two constant coupling elements 803 and 805 on one hand, and between each of them and the tunable coupling element 804 on the other hand. In particular, the respective coupling areas 1301 and 1302 of the first and second constant coupling elements both comprise a first edge adjacent to the first edge of the other coupling area and a second edge adjacent to a respective edge of the tunable coupling element 804.

A generally annular geometry is used for the tunable coupling element 804 and the coupling areas 1301 and 1302 in FIG. 13. The tunable coupling element 804 occupies a first sector of an annular two-dimensional region. Each of the respective coupling areas 1301 and 1302 of the first and second constant coupling elements 803 and 805 occupies a respective further sector of the annular two-dimensional region. These further sectors are adjacent sectors of the annular two-dimensional region. Together the first sector and the further sectors cover the whole of the annular two-dimensional region. Capacitance-enhancing forms, like the interleaved fingers in FIG. 13, can be used at any of the edges of adjacent sectors.

Figure 14:
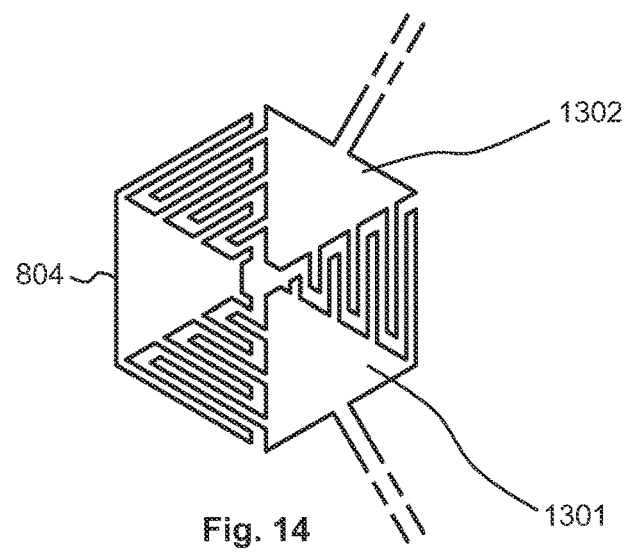
FIG. 14 illustrates one possible variation of a part of the arrangement shown in FIG. 13, according to an embodiment disclosed herein.

The generally annular geometry, if used, does not need to mean a round annular form, but various polygonal shapes may be used. Also, even if the intertwined-finger-type forms (which as such constitute only an example of capacitance-enhancing forms that can be used) are used between the tunable coupling element 804 and the coupling areas 1301 and 1302 respectively in FIG. 13, this is not an essential feature. FIG. 14 shows an alternative embodiment where an annular, hexagonal form is used for the tunable coupling element 804 and the coupling areas 1301 and 1302. Also, in the embodiment of FIG. 14 the intertwined-finger-type forms are used between the coupling areas 1301 and 1302 in addition to their use between the tunable coupling element 804 and each individual coupling area 1301 and 1302. The generally annular geometry can also be used without using the intertwined-finger-type forms between any of the areas involved.

Figure 15:
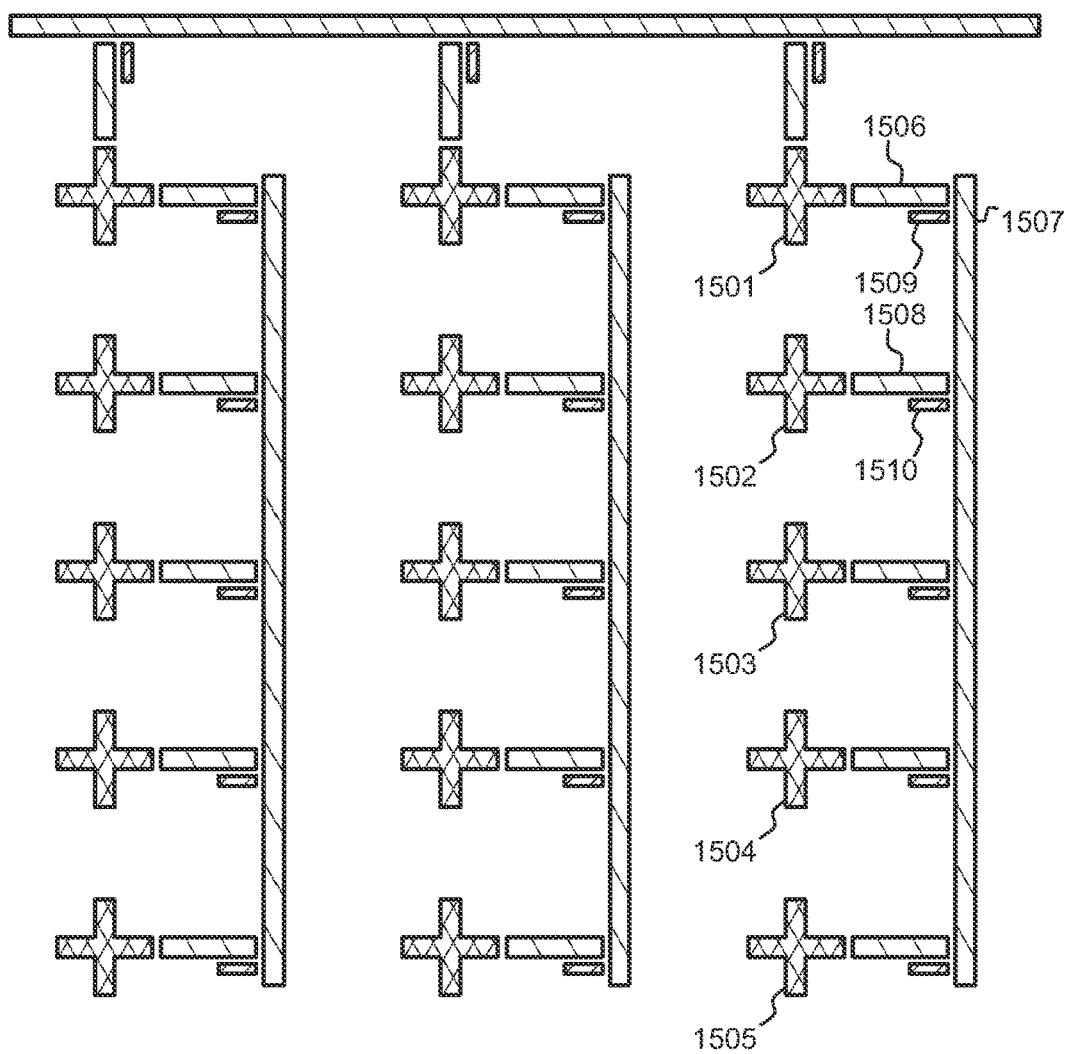
FIG. 15 illustrates a generalization of the principle of FIG. 8 to an arrangement with a larger number of qubits according to an embodiment disclosed herein.

FIG. 15 illustrates an example of how tunable couplers conformant with the principles described above can be used in a quantum computing circuit that comprises a number of qubits. As an example, the rightmost column of qubits 1501 to 1505 can be considered. The tunable coupler to their right comprises a chain of consecutive constant coupling elements. The one closest to the top qubit 1501 may be called a first constant coupling element 1506. Non-galvanic coupling interfaces are formed between consecutive constant coupling elements in the chain: as an example, following the chain one may jump over non-galvanic coupling interfaces from the first constant coupling element 1506 to the vertically directed constant coupling element 1507 and to a further constant coupling element 1508. The tunable coupler comprises at least two tunable coupling elements, of which the tunable coupling elements 1509 and 1510 are examples. Each of these tunable coupling elements is adjacent to a respective one of the non-galvanic coupling interfaces formed between consecutive constant coupling elements in the chain.

As shown in the example of FIG. 15, at least some of the constant coupling elements in the tunable coupler may constitute a shared bus, through which connections to and from a number of different qubits is possible.

Variations and modifications to the embodiments described above are possible without departing from the scope of the appended claims. For example, the qubits may be of any type of electric qubits which have sufficient voltage support for given coupler impedance, including but not being limited to transmons and quantum dot qubits. Various capacitive and other non-galvanic coupling methods are known as such to the person skilled in the art, and they can be used in place of or in addition to what has been described above.

The invention claimed is:

1. A tunable coupler for making a controllable coupling to at least a first qubit and a second qubit, the tunable coupler comprising:
   a first constant coupling element; and
   a tunable coupling element,
   wherein the first constant coupling element forms a first non-galvanic coupling interface to at least the first qubit at a first extremity of the first constant coupling element distant from the tunable coupling element, and
   wherein the tunable coupling element is located adjacent to a second non-galvanic coupling interface formed as an interface to the second qubit located at a second extremity of the first constant coupling element.

2. The tunable coupler according to claim 1, wherein the first constant coupling element is a waveguide.

3. The tunable coupler according to claim 2, wherein the first constant coupling element is a waveguide resonator.

4. The tunable coupler according to claim 1, wherein the first constant coupling element is a lumped element resonator.

5. The tunable coupler according to claim 1, wherein the first constant coupling element is a conductor island.

6. A tunable coupler for making a controllable coupling to at least a first qubit, the tunable coupler comprising:
   a first constant coupling element;
   a second constant coupling element; and
   a tunable coupling element,
   wherein the first constant coupling element forms a first non-galvanic coupling interface to at least the first qubit at a first extremity of the first constant coupling element distant from the tunable coupling element, and
   wherein the second constant coupling element forms a second non-galvanic coupling interface to a further circuit element at an extremity of the second constant coupling element distant from the tunable coupling element, and
   the tunable coupling element is located adjacent to a third non-galvanic coupling interface formed between the first and second constant coupling elements.

7. The tunable coupler according to claim 6, wherein the second constant coupling element is one of a waveguide, a waveguide resonator, a lumped element resonator, or a conductor island.

8. The tunable coupler according to claim 6, wherein the first and second constant coupling elements are waveguides, and wherein each of the first and second constant coupling elements includes a respective coupling area at the respective extremity adjacent to which the tunable coupling element is located.

9. The tunable coupler according to claim 8, wherein the respective coupling areas of the first and second constant coupling elements both comprise a first edge adjacent to the first edge of the other coupling area and a second edge adjacent to a respective edge of the tunable coupling element.

10. The tunable coupler according to claim 8, wherein the tunable coupling element occupies a first sector of an annular two-dimensional region, and wherein each of the respective coupling areas of the first and second constant coupling elements occupies a respective further sector of the annular two-dimensional region.

11. The tunable coupler according to claim 10, wherein the further sectors are adjacent sectors of the annular two-dimensional region, and wherein together the first sector and the further sectors cover the whole of the annular two-dimensional region.

12. The tunable coupler according to claim 1, wherein the tunable coupler includes a chain of consecutive constant coupling elements, of which the first constant coupling element is one, with non-galvanic coupling interfaces formed between consecutive constant coupling elements in the chain.

13. The tunable coupler according to claim 12, wherein the tunable coupler includes at least two tunable coupling elements, each of the at least two tunable coupling elements being adjacent to a respective one of the non-galvanic coupling interfaces formed between consecutive constant coupling elements in the chain.

14. A quantum computing circuit comprising:
   a tunable coupler comprising a first constant coupling element and a tunable coupling element; and
   at least two qubits, wherein the first constant coupling element forms a first non-galvanic coupling interface to a first qubit of the at least two qubits at a first extremity of the first constant coupling element distant from the tunable coupling element, and wherein the tunable coupling element is located adjacent to a second non-galvanic coupling interface formed as an interface to a second qubit of the at least two qubits at a second extremity of the first constant coupling element so that the tunable coupler forms a controllable coupling between the at least two qubits.

15. A quantum computing circuit comprising:
a tunable coupler comprising a first constant coupling element, a second constant coupling element, and a tunable coupling element;
at least one qubit; and
at least one further circuit element,
wherein the first constant coupling element forms a first non-galvanic coupling interface to the at least one qubit at a first extremity of the first constant coupling element distant from the tunable coupling element, and
wherein the second constant coupling element forms a second non-galvanic coupling interface to the at least one further circuit element at a second extremity of the second constant coupling element distant from the tunable coupling element, and
wherein the tunable coupling element is located adjacent to a third non-galvanic coupling interface formed between the first and second constant coupling elements so that the tunable coupler forms a controllable coupling to the at least one qubit.

* * * * *

UNITED STATES PATENT AND TRADEMARK OFFICE
CERTIFICATE OF CORRECTION

| | | |
|---|---|---|
| PATENT NO. | : 12,131,225 B2 | Page 1 of 1 |
| APPLICATION NO. | : 17/195165 | |
| DATED | : October 29, 2024 | |
| INVENTOR(S) | : Johannes Heinsoo | |

It is certified that error appears in the above-identified patent and that said Letters Patent is hereby corrected as shown below:

On the Title Page

Please add Item (30) the "Foreign Application Priority Data" under the "Prior Publication Data" to read as follows:
Oct. 30, 2020 (EPO) ............................................. 20204967

Signed and Sealed this
Twenty-fifth Day of November, 2025

John A. Squires
*Director of the United States Patent and Trademark Office*